United States Patent

Kanisawa et al.

[11] 4,078,187
[45] Mar. 7, 1978

[54] PIEZOELECTRIC SWITCHING DEVICE

[75] Inventors: Hajime Kanisawa; Korzi Tanagawa, both of Tokyo, Japan

[73] Assignee: Oki Electric Industry Co., Ltd., Tokyo, Japan

[21] Appl. No.: 715,551

[22] Filed: Aug. 18, 1976

[51] Int. Cl.² .............................. H01L 41/04
[52] U.S. Cl. .................... 310/319; 310/339
[58] Field of Search .......... 310/8.3, 8.7, 319; 340/365 A; 200/181; 317/DIG. 11

[56] References Cited

U.S. PATENT DOCUMENTS

| | | | |
|---|---|---|---|
| 3,464,531 | 9/1969 | Herr et al. | 310/8.3 X |
| 3,586,888 | 6/1971 | Dorfman | 310/8.3 |
| 3,725,908 | 4/1973 | Brisbarre et al. | 310/8.3 X |
| 3,898,534 | 8/1975 | Mohr | 310/8.7 X |
| 3,935,485 | 1/1976 | Yoshida et al. | 310/8.3 X |
| 4,015,151 | 3/1977 | Mohr | 310/8.7 |

Primary Examiner—Mark O. Budd
Attorney, Agent, or Firm—Peter L. Berger

[57] ABSTRACT

A contactless switching device in which a mechanical displacement is converted into an electric signal by a piezoelectric element so that make and break of the circuit is effected by this electric signal.

3 Claims, 2 Drawing Figures

PIEZOELECTRIC SWITCHING DEVICE

BACKGROUND OF THE INVENTION

Generally, the switching devices may be divided roughly into two types: contact-incorporated type and contactless type. The contact-incorporated type switching devices, which are called by different names such as reed switches, rubber type switches, mechanical switches, etc., depending on the kind of the element(s) used for effecting switching of the electric circuit, involve some undesirable problems in use, such as chattering, variation of contact resistance, fusing of the contacts, etc.. Therefore, the contactless switching devices, which are free of such troubles, are prevalently used in applications where high reliability is required.

Heretofore, the contactless switches utilizing the so-called hall effect have been popularly used, but they still have some serious problems such as high cost of the intergrated amplification circuit including the "hall elements" and high power consumption.

SUMMARY OF THE INVENTION

The present invention is intended to provide an improved contactless switching device using a piezo-electric element as means for converting a mechanical displacement into an electric signal and a complementary MOS integrated circuit as means for shaping and amplifying such electric signal.

OBJECTS OF THE INVENTION

The first object of the present invention is to appreciably simplify the operating mechanism by using a piezo-electric element at the signal input.

The second object of the invention is to allow manufacture of the device at low cost by minimizing the required number of component parts of the device and using a piezo-electric element that can be manufactured on a mass production basis.

The third object of the invention is to provide a switching device of a low power consumption type by eliminating the power-consuming parts.

The fourth object of the invention is to provide a wide operating range that spans usually from about 1.5 V to 16V.

DETAILED DESCRIPTION OF THE INVENTION

Figure 1:
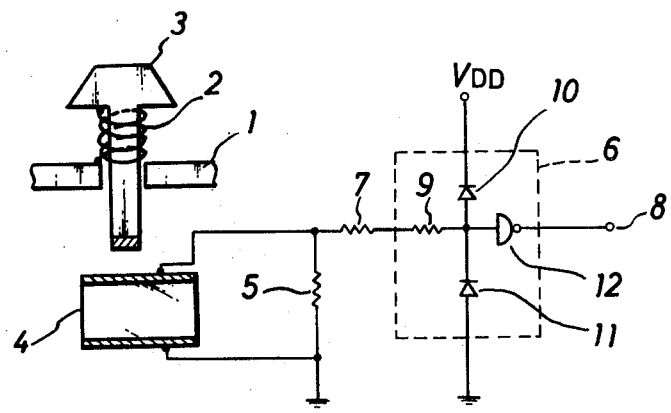
FIG. 1 is a diagram illustrating an embodiment of the present invention.

Referring first to FIG. 1 which illustrates the structural arrangement of the device of this invention, it will be seen that an operating key 3 loaded with a spring 2 is provided on a support block 1. Reference numeral 4 designates a piezo-electric element having electrodes at its both ends, and numeral 5 indicates a load resistance of said piezo-electric element. The section 6 encompassed by a dotted line constitutes an equivalent circuit of a complementary MOS inverter integrated circuit having connected thereto a protective resistance 7 and an output terminal 8. Numeral 9 refers to a gate protective resistance provided in said complementary MOS integrated circuit, 10 and 11 the protective diodes also provided in said integrated circuit, 12 an inverter circuit, and $V_{DD}$ a power source.

The contactless switch having the above-described arrangement of this invention oprates as follows.

When the operating key 3 is pushed down to apply pressure to the piezo-electric element 4, a voltage develops across both ends of the load resistance 5 connected to the upper and lower electrodes of said element. Such voltage can be set sufficiently greater than the value detectable with the complementary MOS integrated circuit by suitably selecting the piezo-electric element and the operating key as well as its operating mechanism, so that the force required for pushing down the operating key 3 may be slight. Also, even when the voltage of the piezo-electric element applied to the complementary MOS integrated circuit 6 is unduly high, there is no fear that the gate of the integrated circuit will be broken, as such gate is clamped by the gate protective resistance 9 and diodes 10, 11 provided in the integrated circuit element. However, in case the value of the gate protective resistance is not enough to cope with the excess voltage, an additional protective resistance 7 with proper resistivity is provided outside of the circuit.

Thus, the voltage produced across both ends of the load resistance 5 is passed through the external protective resistance 7 and detected by the complementary MOS integrated circuit 6. When this voltage is greater than the threshold voltage of the complementary MOS integrated circuit, no voltage (0 V) appears at the output terminal 8, but when the former is smaller than the latter, an output amplified and shaped as a binary level of the source voltage (for example 5 V) of the complementary MOS integrated circuit is obtained at the output terminal 8.

Figure 2:
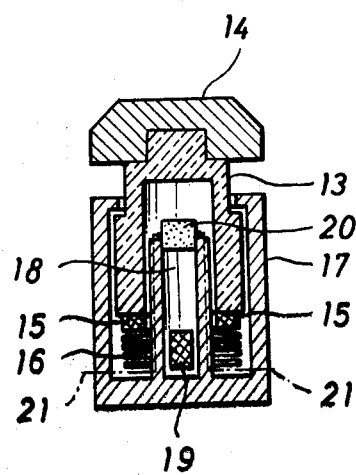
FIG. 2 is a vertical sectional view showing an embodiment of the essential mechanical setup of the present invention.

Referring now to FIG. 2, there is shown a diagrammatic sectional view showing an embodiment of the mechanical setup of the device of this invention.

The operating key 13 has at its top a key top 14 and at its bottom a permanent magnet such as a ring magnet 15. Disposed below said ring magnet 15 is a means, such as a spring 16, for pushing back the operating key 13 to its original position. Said ring magnet 15 may be secured to the lower end of the operating key 13, or the side opposite from the key top 14, or may be simply placed on the spring 16. The casing 17 has a chamber 18 provided substantially parallel to the movement of said operating key 13, and a floating permanent magnet 19 is movably housed in said chamber 18. It will be also seen that a piezo-electric element 20 is provided at the end of said chamber 18. This piezo-electric element 20 is so located as to cap the chamber 18 so as to prevent said floating permanent magnet 19 from running out of the chamber 18 when said magnet moves therein. Said piezo-electric element 20 is also provided with leads 21 to the outside.

In operation of the instant embodiment of this invention, when the operator pushes down the operating key 13, the ring magnet 15 which moves along with said operating key 13 enters a mutual interference region where it interferes with the floating permanent magnet 19 contained in the chamber 18 in the casing 17, with the result that said movable permanent magnet 19 is urged to move rapidly toward the piezo-electric element 20 provided at an end of the chamber 18 owing, for example, to the repulsion developed by approach of the same-polarity ends of the two magnets and impinges against the piezo-electric element 20. This impinging speed is always substantially constant regardless of the speed at which said operating key 13 is pushed down. The signal (voltage) produced across both ends of the load resistance 5 of FIG. 1 connected to the piezo-electric element 20 by said impingement of the permanent magnet 19 is shaped and amplified by the complementary MOS integrated circuit 6 to obtain a desired output.

Although an inverter circuit is used as the complementary MOS integrated circuit in the shown embodiment of this invention, it is possible to employ other means such as one-shot multivibrator or flip-flops which provide substantially same effect as described above.

The contactless switching device according to the present invention, which has been described above by way of an embodiment thereof, is possessed of the outstanding advantages such as mentioned below. Firstly, since a piezo-electric element is used at the signal input, the key top and its surrounding mechanism are extremely simplified. Secondarily, the manufacturing cost of the device is lowered owing to the reduced number of component parts and high mass-producibility ot the piezo-electric element used in the device. Thirdly, the device is of a low power consumption type because of elimination of the power-consuming parts. Fourthly there is provided a wide operating voltage range which, though depending on that of the complementary MOS integrated circuit, is usually from 1.5 V to 16 V.

As described above, the present invention provides a contactless switch which is extremely low in manufacturing cost as well as in power consumption through combination of a piezo-electric element and a complementary MOS integrated circuit.

What is claimed is:

1. A contactless switching device comprising an operating key, a piezo-electric element for converting the mechanical displacement made by said operating key into an electric signal, a complementary MOS integrated circuit for shaping and amplifying the electric signal generated from said piezo-electric element, a permanent magnet arranged movable along with said operating key, and a floating permanent magnet arranged movable in response to the first-said permanent magnet and adapted to impinge against said piezo-electric element to generate said electric signal.

2. A contactless switching device claimed in claim 1, wherein said piezo-electric element is disposed at an upper part while said floating permanent magnet is disposed at a lower part, and wherein said floating permanent magnet is arranged to jump up in response to said permanent magnet to impinge against said piezo-electric element.

3. A contactless switching device claimed in claim 1, wherein said permanent magnet is ring-shaped and said floating permanent magnet is disposed within the ring of said permanent magnet.

* * * * *